(12) United States Patent
Ye et al.

(10) Patent No.: US 10,553,809 B2
(45) Date of Patent: Feb. 4, 2020

(54) LAMINATED ORGANIC LIGHT EMITTING DIODE DISPLAY PANEL AND MANUFACTURING METHOD THEREOF, AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Zhijie Ye, Beijing (CN); Rui Peng, Beijing (CN); Xinxin Wang, Beijing (CN); Yikun Dou, Beijing (CN); Wenbin Jia, Beijing (CN); Yue Hu, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/971,152

(22) Filed: May 4, 2018

(65) Prior Publication Data
US 2019/0097159 A1    Mar. 28, 2019

(30) Foreign Application Priority Data
Sep. 28, 2017    (CN) .......................... 2017 1 0900924

(51) Int. Cl.
| | |
|---|---|
| *H01L 51/50* | (2006.01) |
| *H01L 27/32* | (2006.01) |
| *H01L 51/56* | (2006.01) |

(52) U.S. Cl.
CPC ...... *H01L 51/5096* (2013.01); *H01L 51/5044* (2013.01); *H01L 51/56* (2013.01); *H01L 27/3246* (2013.01); *H01L 2227/323* (2013.01)

(58) Field of Classification Search
None
See application file for complete search history.

(56) References Cited

U.S. PATENT DOCUMENTS

2006/0087225 A1    4/2006  Liao et al.
2016/0141538 A1    5/2016  Lee et al.
(Continued)

FOREIGN PATENT DOCUMENTS

| CN | 101044641 A | 9/2007 |
|---|---|---|
| CN | 105609648 A | 5/2016 |

(Continued)

OTHER PUBLICATIONS

Jun. 26, 2019—(CN) Office Action application 201710900924.0 with English Translation.

*Primary Examiner* — Zandra V Smith
*Assistant Examiner* — Lawrence C Tynes, Jr.
(74) *Attorney, Agent, or Firm* — Banner & Witcoff, Ltd.

(57) ABSTRACT

A laminated Organic Light Emitting Diode (OLED) display panel and a manufacturing method thereof and a display device are provided. The laminated OLED display panel includes: a pixel partition layer, which defines a plurality of openings; a first charge generate layer, which has a first doping type, being positioned on the pixel partition layer; and a second charge generate layer, which has a second doping type, being positioned on the first charge generate layer. The laminated OLED display panel further includes: a barrier layer, which is positioned between the first charge generation layer and the second charge generation layer and at least corresponds to a position of the pixel partition layer.

16 Claims, 4 Drawing Sheets

(56) References Cited

U.S. PATENT DOCUMENTS

| | | | |
|---|---|---|---|
| 2016/0155978 A1 | 6/2016 | Park | |
| 2017/0162792 A1* | 6/2017 | Kim et al. | |
| 2017/0194387 A1* | 7/2017 | Oh | H01L 51/5218 |
| 2018/0076267 A1* | 3/2018 | Song | G09G 3/3225 |
| 2019/0051243 A1 | 2/2019 | Li et al. | |

FOREIGN PATENT DOCUMENTS

| | | |
|---|---|---|
| CN | 105655370 A | 6/2016 |
| CN | 106157896 A | 11/2016 |
| CN | 107017349 A | 8/2017 |

* cited by examiner

LAMINATED ORGANIC LIGHT EMITTING DIODE DISPLAY PANEL AND MANUFACTURING METHOD THEREOF, AND DISPLAY DEVICE

CROSS-REFERENCE TO RELATED APPLICATION

This application claims priority to and the benefit of Chinese Patent Application No. 201710900924.0 filed on Sep. 28, 2017, which application is incorporated herein in its entirety.

TECHNICAL FIELD

Embodiments of the present disclosure relate to a laminated Organic Light Emitting Diode (OLED) display panel and a manufacturing method thereof, and a display device including the laminated OLED display panel.

BACKGROUND

Compared to a conventional OLED display panel, a laminated OLED display panel can effectively improve brightness and luminous efficiency, and can also implement high brightness in a low charge density so as to avoid electric field breakdown, thereby prolonging the service life of the laminated OLED display panel.

Along with the user's increasing requirement on image display quality, a resolution of the laminated OLED display panel becomes higher and higher, but when the resolution is improved, a new problem is brought about, i.e., when a certain characteristic pixel is displayed, one or more pixels around the characteristic pixel will also be simultaneously lighted up, resulting in a cross-talk phenomenon among the pixels.

SUMMARY

According to a first aspect of the present disclosure, there is provided a laminated OLED display panel, comprising: a pixel partition layer, which defines a plurality of openings; a first charge generate layer, which has a first doping type, being positioned on the pixel partition layer; and a second charge generate layer, which has a second doping type, being positioned on the first charge generate layer; the laminated OLED display panel further comprising: a barrier layer, which is positioned between the first charge generation layer and the second charge generation layer and at least corresponds to a position of the pixel partition layer.

According to a second aspect of the present disclosure, there is provided a manufacturing method of a laminated OLED display panel, comprising: forming a pixel partition layer, the pixel partition layer defining a plurality of openings; forming a first charge generation layer on the pixel partition layer, the first charge generation layer having a first doping type; forming a second charge generation layer on the first charge generate layer, the second charge generation layer having a second doping type; and forming a barrier layer between the first charge generation layer and the second charge generate layer, the barrier layer at least corresponding to a position of the pixel partition layer.

According to a third aspect of the present disclosure, there is provided a laminated OLED display device, the laminated OLED display device comprising the laminated OLED display panel described above.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure, but not limitative of the disclosure.

DETAILED DESCRIPTION

Figure 1:
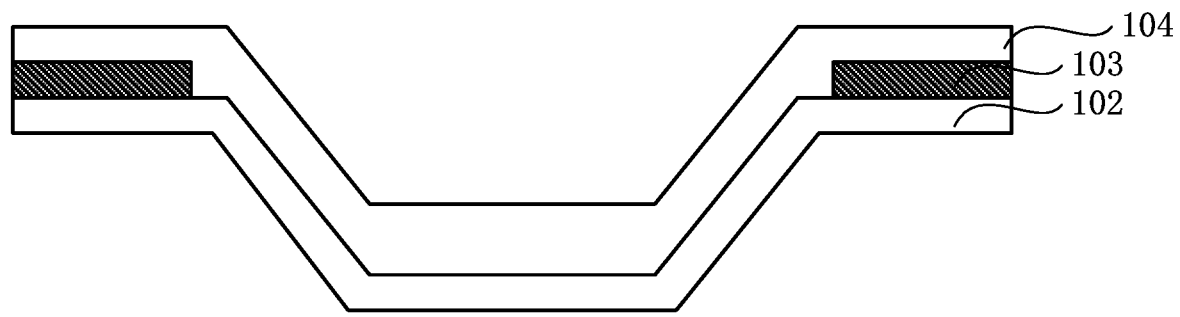
FIG. 1 illustrates a structure of a laminated OLED display panel in an embodiment of the present disclosure.

In order to make objects, technical solutions and advantages of the embodiments of the disclosure apparent, the technical solutions of the embodiments of the disclosure will be described in a clearly and fully understandable way in connection with the drawings related to the embodiments of the disclosure. It is obvious that the described embodiments are just a part but not all of the embodiments of the disclosure. Based on the described embodiments of the disclosure herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In related art, when certain p-doped or n-doped materials are used in a Charge Generation Layer (CGL) of a laminated OLED display panel, due to a relatively high transverse conductivity of the p-doped or n-doped material, a cross-talk problem may be caused. In order to solve the above-mentioned problem, in conventional technology, the p-doped or n-doped material may be replaced with a material having a relatively low transverse conductivity, but selectable doped materials may be greatly reduced to cause cost rising, and the efficacy of a device may be affected.

Based on the contents above, exemplary embodiments of the present disclosure firstly provide a laminated OLED display panel, including: a pixel partition layer, the pixel partition layer defining a plurality of openings; a first charge generate layer, which has a first doping type, being positioned on the pixel partition layer; and a second charge generate layer, which has a second doping type, being positioned on the first charge generate layer. The laminated OLED display panel further includes: a barrier layer, which is positioned between the first charge generation layer and the second charge generation layer and at least corresponds to a position of the pixel partition layer.

In the laminated OLED display panel, by arranging the barrier layer between two charge generation layers of different doping types and above the pixel partition layer, in one aspect, a pixel leakage current in the pixel partition layer is blocked, and the light emission occurred in a non-pixel region is avoided so as to decrease its influence on chromaticity of the display panel; in another aspect, the barrier layer enables an impedance of a leakage current channel to rise so as to solve the cross-talk problem between adjacent pixel regions.

Figure 2:
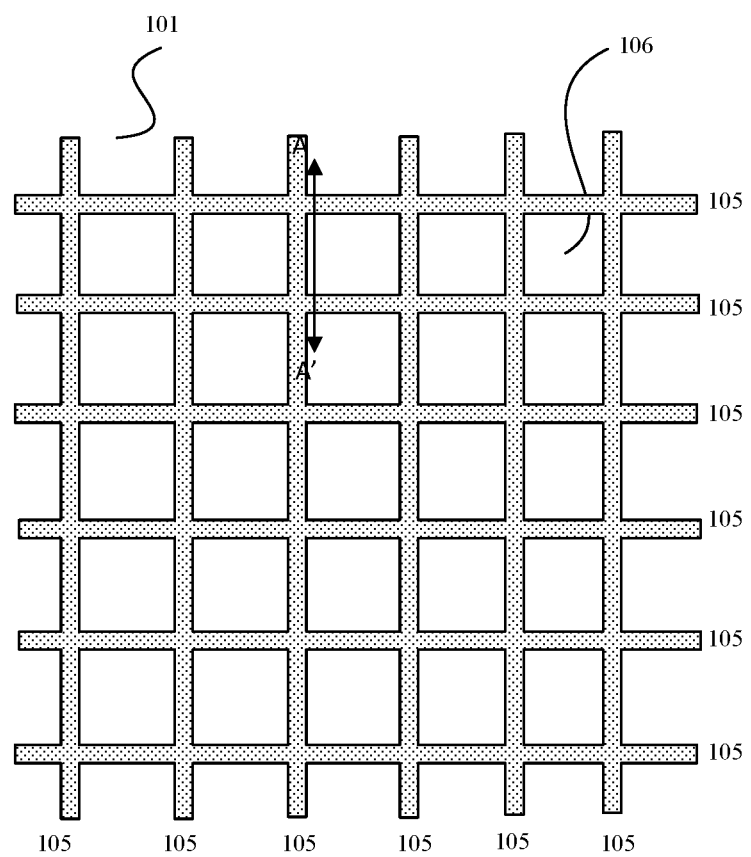
FIG. 2 illustrates a structure of a pixel partition layer in the embodiment of the present disclosure.

For example, as illustrated in FIG. 1 and FIG. 2, a laminated OLED display panel 100 provided by an embodiment of the present disclosure includes: a pixel partition layer 101, a first charge generation layer 102, a barrier layer 103 and a second charge generation layer 104; the pixel partition layer 101 defines a plurality of openings (not shown), and a sub-pixel unit is formed in each opening; the first charge generation layer 102 has a first doping type and is positioned on the pixel partition layer 101 and in the opening; the barrier layer 103 is positioned on a portion of the first charge generation layer 102, which corresponds to the pixel partition layer; and the second charge generation layer 104 has a second doping type and is positioned on the barrier layer 103 and the remaining portion of the first charge generation layer 102 that is not covered by the barrier layer 103.

For example, the pixel partition layer 101 may be made from an inorganic or organic insulation material, such as acrylic, polyimide, polymethyl methacrylate (PMMA) and the like. FIG. 2 illustrates a structure of the pixel partition layer. The pixel partition layer 101 includes a plurality of barrier walls 105 which interact with each other to form a plurality of openings 106, and the opening 106 is used for forming the sub-pixel unit.

For example, the first charge generation layer 102 has the first doping type, the doping type particularly is N-type doping or P-type doping for example. When the doping type is the N-type doping, the first charge generation layer may include metal or an N-type doped organic material. For example, the metal comprises at least one of Li, Na, K, Rb, Cs, Mg, Ca, Ba, Sm, Eu, Tb, Yb, or the like. For example, the N-type doped organic material may include N-type dopant and a matrix material. The N-type dopant may be alkali metal, an alkali metal compound, alkali-earth metal, an alkali-earth metal compound, or the like, and the matrix material comprises at least one of tris (8-hydroxyquinoline) aluminum, quinolinol derivatives, triazine, indole derivatives, or thioazole derivatives, or the like. When the doping type is the P-type doping, the first charge generation layer may be transition metal oxide or a P-type doped organic material. For example, the transition metal in the transition metal oxide comprises at least one of Ti, V, Cr, Mn, Fe, Co, Ni, Cu, In, Sn, Ge, Y, Mo, Ta, W, or the like. For example, the P-type doped organic material includes P-type dopant and a matrix material, The P-type dopant comprises at least one of F4-TCNQ: m-MTDATA, MoO3: NPB, FeCl3: NPB, HAT-CN, or the like, and the matrix material may be the same as or different from the matrix material in the N-type charge generate layer. The first charge generation layer 102 may be formed by evaporation or the like, which is not limited to the exemplary embodiment.

For example, the doping type of the second charge generation layer 104 is contrary to the doping type of the first charge generation layer 102. For example, when the first charge generation layer 102 adopts the N-type doping, the second charge generation layer 104 adopts the P-type doping; and when first charge generation layer 102 adopts the P-type doping, the second charge generation layer 104 adopts the N-type doping. The material and fabricating method of the second charge generation layer 104 may be the same as or different from those of the first charge generation layer 102, which is not repeated herein.

For example, the barrier layer 103 is between the first charge generation layer 102 and the second charge generation layer 104, and is positioned on the portion of the first charge generation layer 102, which corresponds to the pixel partition layer 101. The barrier layer 103 may adopt any insulation material which may be an organic material or an inorganic material, as long as the insulation material is capable of blocking the pixel leakage current in the pixel partition layer 101. For example, the barrier layer 103 comprises at least one of silicon oxide, silicon nitride, aluminum oxide, aluminum nitride, resin, polymer and the like. In order to increase the adhesion between the barrier layer 103 and the first charge generation layer 102, in the embodiment, the barrier layer 103 may be formed by an inkjet printing method.

Figure 5:
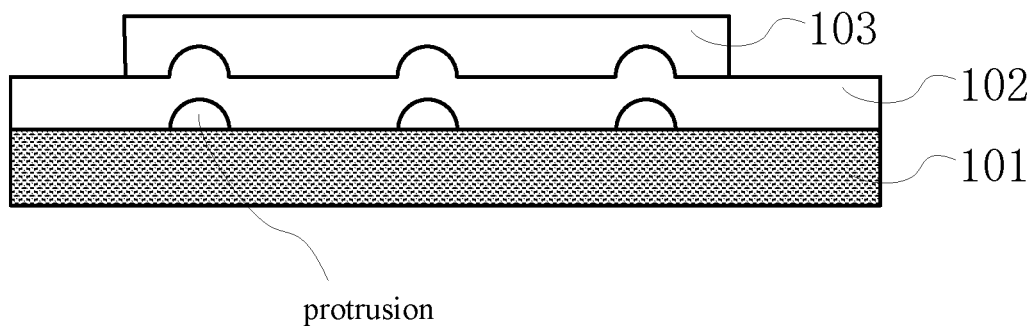
FIG. 5 illustrates a surface topography of a pixel partition layer in yet another embodiment of the present disclosure.

Moreover, in order to further increase the adhesion between the barrier layer 103 and the first charge generation layer 102, for example, a surface of the pixel partition layer 101, which is in contact with the first charge generate layer 102, may be an uneven surface. For example, the uneven surface has a concave structure or a convex structure, and the concave structure or the convex structure may be formed by a patterning method which includes, but is not limited to, dry etching, wet etching, nanoimprint, and the like. The concave structure is, for example, a groove which has a shape of a hemisphere, triangular cone, pyramid concave, or the like. The convex structure is, for example, a protrusion which has a shape of a hemisphere, triangular cone, pyramid protrusion, or the like. For example, a hemispherical protrusion as illustrated in FIG. 5. Due to formation of the concave-convex structure on the surface of the pixel partition layer 101, the surface of the first charge generation layer 102, which is in contact with the barrier layer 103, is of a concave-convex structure so as to increase the adhesion between the barrier layer 103 and the first charge generation layer 102. It is understood that those skilled in the art may adopt other concave-convex structures, which is not limited to the embodiments.

In the laminated OLED display panel according to the above-mentioned embodiment, the barrier layer is arranged between the first charge generation layer and the second charge generate layer, and the barrier layer is positioned above the pixel partition layer. In one aspect, the barrier layer cuts off longitudinal movement of charge carriers in both the first charge generation layer and the second charge generation layer so as to prevent impure chromaticity of the display panel, which is caused by a case that charge carriers are compounded in the pixel partition layer to enable a non-pixel region to emit light. In another aspect, experimental data illustrates that the barrier layer may also enable the impedance of the leakage current channel to be risen so as to solve the cross-talk problem between the adjacent pixel regions. In yet another aspect, the material of the barrier layer is easy to obtain, thereby greatly reducing the production cost; moreover, the pixel leakage current can be reduced by forming the barrier layer between different doping types of charge generate layers, which is relatively simple in structure, so the production time is saved.

Figure 3:
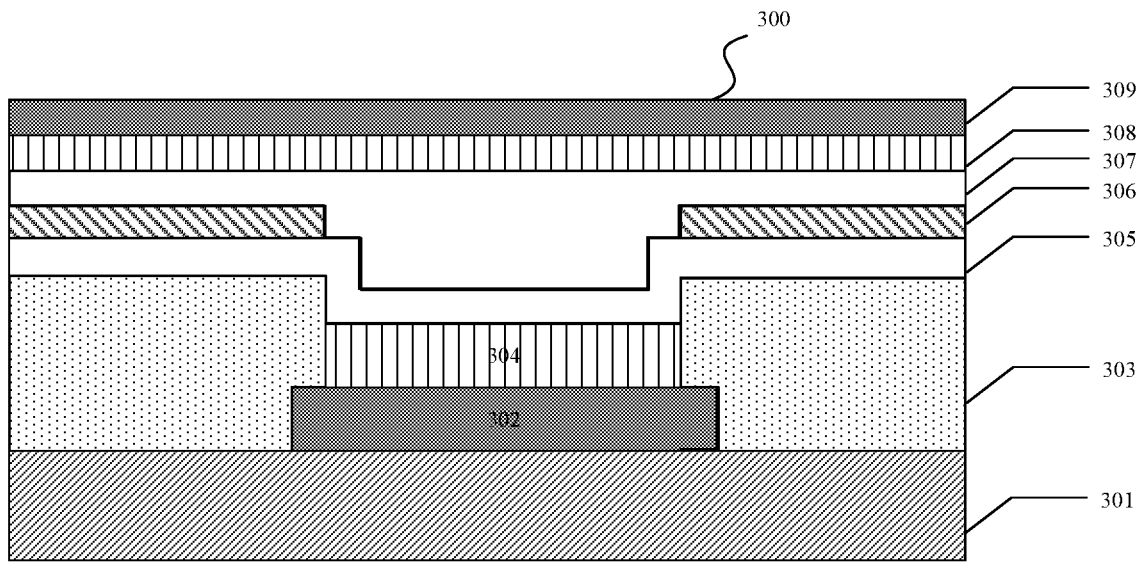
FIG. 3 illustrates a structure of a laminated OLED display panel in another embodiment of the present disclosure.

FIG. 3 illustrates a laminated OLED display panel 300 in another embodiment of the present disclosure. The laminated OLED display panel 300 sequentially includes: a base substrate 301, a first electrode 302, a pixel partition layer 303, a first electroluminescent layer 304, a first charge generation layer 305, a barrier layer 306, a second charge generation layer 307, a second electroluminescent layer 308, and a second electrode 309. The first electrode 302 is positioned on the base substrate 301, and partially or completely positioned in an opening of the pixel partition layer 303.

For example, the base substrate 301 may be a glass substrate or a flexible substrate. The flexible substrate may be polycarbonate or polyimide, for those skilled in the art, the material of the base substrate 301 is not limited to the above-mentioned materials, and any material which is suitable for forming the base substrate falls within the scope of the present disclosure.

For example, the first electrode 302 is positioned at the bottom of the opening of the pixel partition layer, and the first electrode 302, for example, is an anode and is used for providing hole carriers. The first electrode 302 may be a transparent electrode layer, the transparent electrode layer may be made from a transparent conductive material with a relatively large work function, e.g., Indium Tin Oxide (ITO), Zinc Tin Oxide (ZTO), Indium Zinc Oxide (IZO), zinc oxide, Gallium Indium Zinc Oxide (GIZO), or the like. Moreover, the first electrode 302 may also be a composite layer including a transparent conductive material layer and a metal layer, e.g., an ITO/Ag/ITO composite layer. In other embodiments, the first electrode 302 may be made from non-transparent material, e.g., ITO/Ag/ITO, AlNd, or the like.

For example, as illustrated in FIG. 3, the first electroluminescent layer 304 is positioned on a side of the first charge generation layer 305, which is distal to the barrier layer 306; and the second electroluminescent layer 308 is positioned on a side of the second charge generation layer 307, which is distal to the barrier layer 306. The first electroluminescent layer 304 and the second electroluminescent layer 308, for example, each comprises at least one of a red electroluminescent layer (R-EML), a green electroluminescent layer (G-EML), a blue electroluminescent layer (B-EML), or the like. Depending on the light emitting mechanism of the electroluminescent layer, e.g., a fluorescent mechanism or a phosphorescent mechanism, the electroluminescent layer may be made from a suitable light emitting material for generating red light, green light or blue light. The first electroluminescent layer 304 and the second electroluminescent layer 308 each may be formed by an ink jetting, rotating, or spray nozzle printing process, or a transferred printing process carried out by utilizing a main substrate under heat or laser, or the like.

For example, the second electrode 309 is positioned on the second electroluminescent layer 308. The second electrode 309, for example, is a cathode and is used for providing electronic carriers. The second electrode 309 may be made from transparent conductive material or metal. The transparent conductive material comprises at least one of ITO, ZTO, IZO, ZnOx, SnOx, GIZO, AZO, or the like. The metal comprises at least one of Ag, Al, Pt, Au, Cr, W, Mo, Ti, Pd or the like, or their alloys.

In one embodiment of the present disclosure, the first electrode 302 is the anode and the second electrode 309 is the cathode, the first charge generation layer 305 adopts the N-type doping, and the second charge generation layer 307 adopts the P-type doping. In another embodiment of the present disclosure, the first electrode 302 may also be a cathode, the second electrode 309 may be an anode, and the doping types of the first charge generation layer 305 and the second charge generation layer 307 are the P type and the N type, respectively.

Figure 4A:
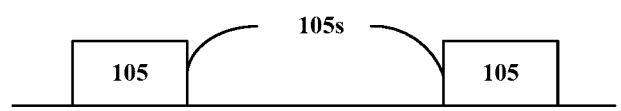
FIG. 4($a$) and FIG. 4($b$) respectively illustrate two variants of a retaining wall of a pixel partition layer in an embodiment of the present disclosure.
Figure 4B:
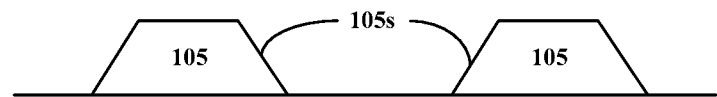

In one embodiment of the present disclosure, a plurality of openings 106 in the pixel partition layer 101 are formed by a photolithography process. FIG. 4(a) illustrates a cross-sectional view of the barrier wall 105 taken along A-A' line of FIG. 2, and FIG. 4(b) illustrates a variant of the barrier wall 105. As illustrated in FIG. 4(a) and FIG. 4(b), a cross section of a barrier wall 105 between two adjacent openings is in a rectangle or trapezoid shape, i.e., the opening has a vertical or inclined side wall 105s. As previously mentioned, a surface of a pixel partition layer may have various concave-convex structures, e.g., triangular cone, pyramid, hemisphere, or the like, so that the adhesion between the pixel partition layer and the first charge generation layer is increased.

For example, as illustrated in FIG. 3, an orthogonal projection of the barrier layer 306 in a plane of the base substrate 301 is overlapped with that of the pixel partition layer 303 in a plane of the base substrate 301.

In one embodiment of the present disclosure, the laminated OLED display panel further includes a plurality of organic functional layers, and the plurality of organic functional layers comprises at least one of a hole injection layer, a hole transport layer, an electron transport layer, or an electron injection layer. Materials and the fabricating methods of the hole injection layer, the hole transport layer, the electron transport layer and the electron injection layer are all conventional materials and methods in the art, which are not elaborated herein. In case that the plurality of organic functional layers are arranged in the laminated OLED display panel, an arrangement sequence of the plurality of organic functional layers depends on types of the first electrode and the second electrode. For example, when the first electrode is an anode and the second electrode is a cathode, the hole injection layer may be arranged close the first electrode, and the electron injection layer may be arranged close to the second electrode.

One embodiment of the present disclosure further provides a manufacturing method of a laminated OLED display panel, including: forming a pixel limitation layer, the pixel partition layer defining a plurality of openings; forming a first charge generation layer on the pixel partition layer, the first charge generation layer having a first doping type; forming a second charge generation layer on the first charge generate layer, the second charge generation layer has a second doping type; and forming a barrier layer between the first charge generation layer and the second charge generate layer, the barrier layer at least corresponding to a position of the pixel partition layer.

Figure 6:
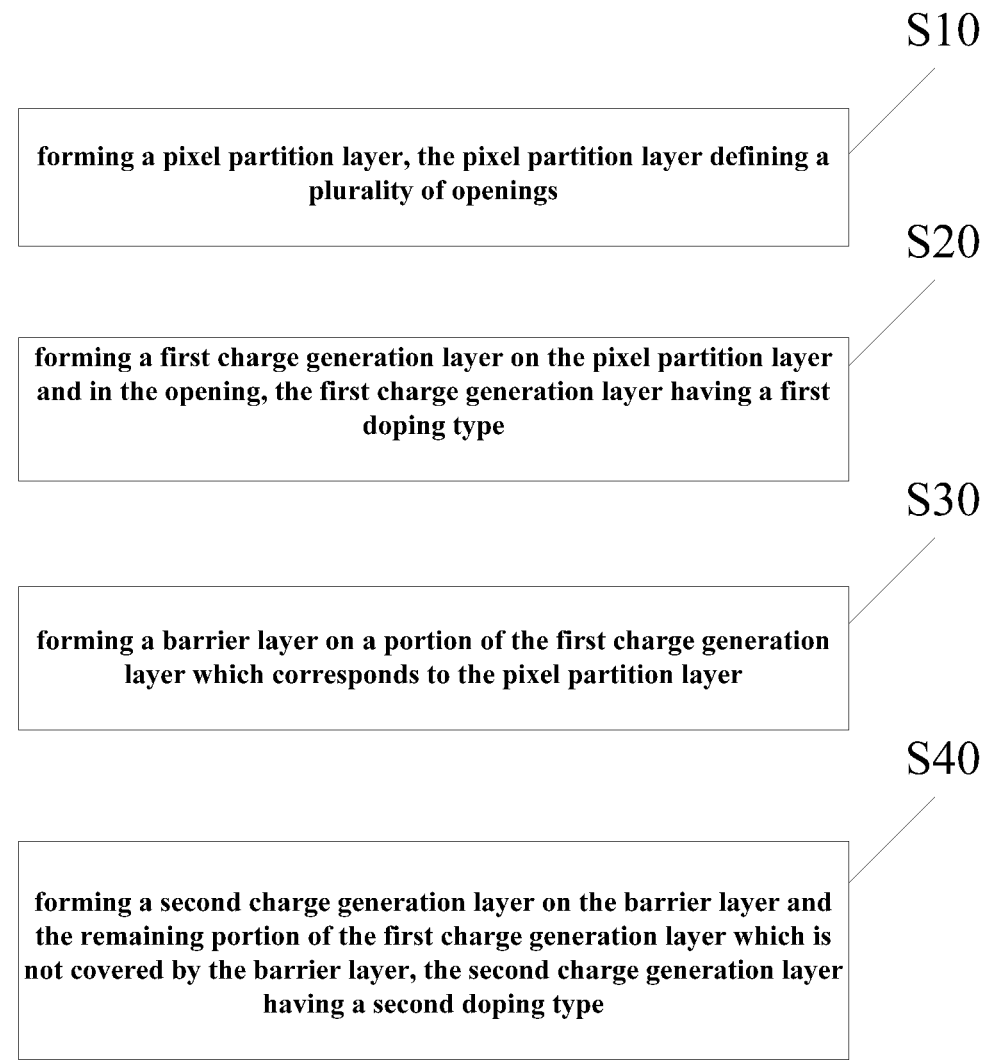
FIG. 6 illustrates a flow chart of manufacturing a laminated OLED display panel in an embodiment of the present disclosure.

For example, FIG. 6 illustrates a manufacturing method of a laminated OLED display panel in one embodiment of the present disclosure, which includes:

S10: forming a pixel partition layer 303, the pixel partition layer 303 defining a plurality of openings;

S20: forming a first charge generation layer 305 on the pixel partition layer 303 and in the opening, the first charge generation layer having a first doping type;

S30: forming a barrier layer 306 on a portion of the first charge generation layer 305 which corresponds to the pixel partition layer 303; and S40: forming a second charge generation layer 307 on the barrier layer 306 and the remaining portion of the first charge generation layer 305 which is not covered by the barrier layer 306, the second charge generation layer 307 having a second doping type.

In the manufacturing method of the laminated OLED display panel, which is provided by the embodiment of the present disclosure, the barrier layer 306 is formed between the first charge generation layer 305 and the second charge generation layer 307, and due to that the barrier layer 306 is formed in a non-pixel region, a pixel leakage current in the pixel partition layer 303 is blocked, and the problem of impure chromaticity caused by the pixel leakage current is solved; moreover, according to experimental data, it can be found that the barrier layer 306 may also avoid a cross-talk phenomenon between adjacent pixels and increase image quality of the laminated OLED display panel.

For example, the manufacturing method of the laminated OLED display panel further includes: forming a first electroluminescent layer 304 on a side of the first charge generation layer 305 distal to the barrier layer 306; and forming a second electroluminescent layer 308 on a side of the second charge generation layer 307 distal to the barrier layer 306. The first electroluminescent layer 304 and the second electroluminescent layer 308 each may comprise at least one of a red electroluminescent layer, a green electroluminescent layer, a blue electroluminescent layer, or the like.

For example, in the manufacturing method, the forming a pixel partition layer includes: forming a concave-convex structure, e.g., a concave structure, on a surface of the pixel partition layer, the surface is in contact with the first charge generate layer. For a specific shape and formation related to the concave-convex structure, please refer to the above-mentioned embodiments, which are not repeated herein.

It is noted that the number of the electroluminescent layers and the number of the charge generation layers in the laminated OLED display panel of the embodiments of the present disclosure are for illustration purpose, which is not for limiting the present disclosure. For example, the laminated OLED display panel in the present disclosure may include N light-emitting units, where N is a positive integer greater than or equal to 2, in this case, the number of both the first charge generation layer and the second charge generation layer is (N−1).

Figure 7:
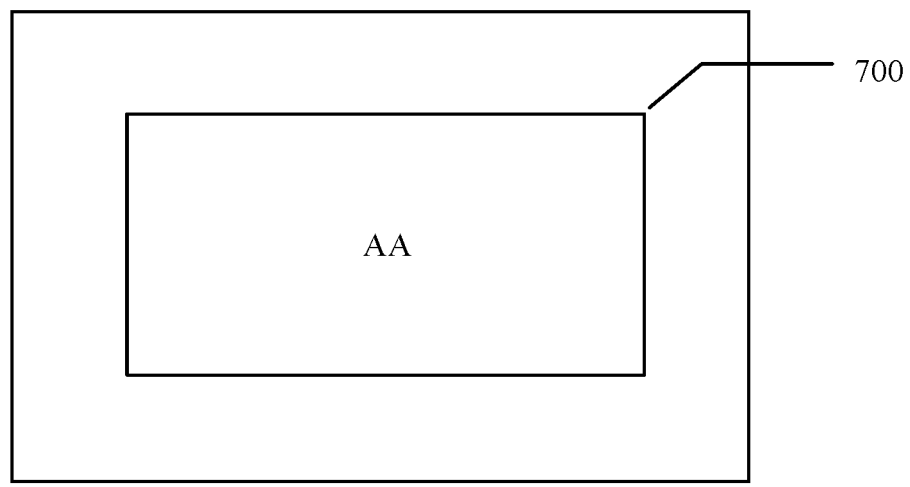
FIG. 7 illustrates a structure of an OLED display device in an embodiment of the present disclosure.

One embodiment of the present disclosure further provides a laminated OLED display device. As illustrated in FIG. 7, the laminated OLED display device includes the above-mentioned laminated OLED display panel 700 so as to form a display region AA.

In one embodiment of the present disclosure, the laminated OLED display device, for example, may be any product or part with a display function, e.g., a mobile phone, a tablet personal computer, a television, a navigator and the like.

In this article, the following points need to be illustrated that:

(1) The drawings of the embodiments of the present disclosure are merely related to structures to which the embodiments of the present disclosure relate, and other structures can refer to general design.

(2) For clarity, in the drawings for describing the embodiments of the present disclosure, a thickness of a layer or a region is amplified or reduced, i.e., those drawings are not drawn according to actual scales.

(3) In a case of no conflict, the embodiments of the present disclosure and the characteristics in the embodiments may be combined mutually to obtain new embodiments.

What is described above is related to the illustrative embodiments of the disclosure only and not limitative to the scope of the disclosure; the scopes of the disclosure are defined by the accompanying claims.

The invention claimed is:

1. A laminated Organic Light Emitting Diode (OLED) display panel, comprising:
   a pixel partition layer, which defines a plurality of openings;
   a first charge generate layer, which has a first doping type, being positioned on the pixel partition layer; and
   a second charge generate layer, which has a second doping type, being positioned on the first charge generate layer;
   the laminated OLED display panel further comprising:
   a barrier layer, which is positioned between the first charge generation layer and the second charge generation layer and at least corresponds to a position of the pixel partition layer; and
   a first electroluminescent layer,
   wherein the first electroluminescent layer is on a side of the first charge generate layer away from the barrier layer; and
   the barrier layer has an opening, and the opening at least partially overlaps the first electroluminescent layer at a direction perpendicular to a panel plane of the laminated OLED display panel.

2. The laminated OLED display panel according to claim 1, wherein the first charge generation layer continuously overlays the pixel partition layer and the plurality of openings, and the barrier layer is positioned on a portion of the first charge generate layer which corresponds to the pixel partition layer.

3. The laminated OLED display panel according to claim 1, further comprising:
   a second electroluminescent layer, which is positioned on a side of the second charge generation layer distal to the barrier layer.

4. The laminated OLED display panel according to claim 1, wherein a surface of the pixel partition layer, which is in contact with the first charge generate layer, comprises a concave-convex structure.

5. The laminated OLED display panel according to claim 1, wherein a region, which is covered by an orthographic projection of the pixel partition layer on the first charge generate layer, of a surface, which is in contact with the barrier layer, of the first charge generate layer is of a concave-convex structure.

6. The laminated OLED display panel according to claim 1, wherein the barrier layer comprises at least one of silicon oxide, silicon nitride, aluminum oxide, aluminum nitride, resin, or polymer.

7. The laminated OLED display panel according to claim 1, further comprising a base substrate, wherein the pixel partition layer, the first charge generate layer, the second charge generation layer and the barrier layer are sequentially positioned on the base substrate, wherein an orthogonal projection of the barrier layer in a plane of the base substrate is overlapped with that of the pixel partition layer in the plane of the base substrate.

8. A laminated OLED display device, comprising the laminated OLED display panel according to claim 1.

9. The laminated OLED display panel according to claim 1, wherein a region, which is covered by an orthographic projection of the pixel partition layer on the first charge generate layer, of a surface, which is in contact with the pixel partition layer, of the first charge generate layer is of a concave-convex structure.

10. The laminated OLED display panel according to claim 1, wherein the barrier layer comprises at least one of aluminum oxide, aluminum nitride, resin, and polymer.

11. A manufacturing method of a laminated OLED display panel, comprising:
    forming a pixel partition layer, the pixel partition layer defining a plurality of openings;
    forming a first charge generation layer on the pixel partition layer, the first charge generation layer having a first doping type;
    forming a second charge generation layer on the first charge generate layer, the second charge generation layer having a second doping type;
    forming a barrier layer between the first charge generation layer and the second charge generate layer, the barrier layer at least corresponding to a position of the pixel partition layer; and
    forming a first electroluminescent layer on a side of the first charge generate layer away from the barrier layer, wherein the barrier layer has an opening, and the opening at least partially overlaps the first electroluminescent layer at a direction perpendicular to a panel plane of the laminated OLED display panel.

12. The manufacturing method of the laminated OLED display panel according to claim 11, wherein the first charge generation layer continuously overlays the pixel partition layer and the plurality of openings, and the barrier layer is formed on a portion of the first charge generate layer, which corresponds to the pixel partition layer.

13. The manufacturing method of the laminated OLED display panel according to claim 11, further comprising:
    forming a second electroluminescent layer on a side of the second charge generate layer distal to the barrier layer.

14. The manufacturing method of the laminated OLED display panel according to claim 11, wherein the forming a pixel partition layer comprises:
    forming a concave-convex structure on a surface of the pixel partition layer, the surface of the pixel partition layer is in contact with a region, which is covered by an orthographic projection of the pixel partition layer on the first charge generate layer, of the first charge generate layer.

15. The manufacturing method of the laminated OLED display panel according to claim 11, wherein the forming a first charge generation layer comprises:
    forming a concave-convex structure on a region, which is covered by an orthographic projection of the pixel partition layer on the first charge generate layer, of a surface of the first charge generate layer, the surface of the first charge generate layer is in contact with the barrier layer.

16. The manufacturing method of the laminated OLED display panel according to claim 11, further comprising:
    providing a base substrate, wherein the pixel partition layer, the first charge generate layer, the second charge generation layer and the barrier layer are sequentially formed on the base substrate, and an orthogonal projection of the barrier layer on a plane of the base substrate is overlapped with that of the pixel partition layer on the plane of the base substrate.

* * * * *